(12) United States Patent
Nakao et al.

(10) Patent No.: US 11,735,418 B2
(45) Date of Patent: Aug. 22, 2023

(54) METHOD FOR FORMING SEMICONDUCTOR LAYERS

(71) Applicant: Nippon Telegraph and Telephone Corporation, Tokyo (JP)

(72) Inventors: Ryo Nakao, Musashino (JP); Tomonari Sato, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/912,244

(22) PCT Filed: Jan. 20, 2021

(86) PCT No.: PCT/JP2021/001837
§ 371 (c)(1),
(2) Date: Sep. 16, 2022

(87) PCT Pub. No.: WO2021/192551
PCT Pub. Date: Sep. 30, 2021

(65) Prior Publication Data
US 2023/0135654 A1 May 4, 2023

Related U.S. Application Data

(63) Continuation-in-part of application No. PCT/JP2020/013237, filed on Mar. 25, 2020.

(51) Int. Cl.
*H01L 21/02* (2006.01)

(52) U.S. Cl.
CPC .. *H01L 21/02647* (2013.01); *H01L 21/02233* (2013.01); *H01L 21/02241* (2013.01); *H01L 21/02381* (2013.01); *H01L 21/02461* (2013.01); *H01L 21/02463* (2013.01); *H01L 21/02466* (2013.01)

(58) Field of Classification Search
CPC ......... H01L 21/02647; H01L 21/02241; H01L 21/02381; H01L 21/02461; H01L 21/02463; H01L 21/02466; H01L 21/02233
See application file for complete search history.

(56) References Cited

U.S. PATENT DOCUMENTS 8,178,427 B2 * 5/2012 Arena ................. H01L 29/2003
438/483
2018/0277368 A1 * 9/2018 Bedell ............... H01L 21/02614
(Continued)

OTHER PUBLICATIONS

Himanshu Kataria et al., *Simple Epitaxial Lateral Overgrowth Process as a Strategy for Photonic Integration on Silicon*, IEEE Journal of Selected Topics in Quantum Electronics, vol. 20, No. 4, 2014, pp. 1-7.
(Continued)

*Primary Examiner* — David Vu
*Assistant Examiner* — Brandon C Fox
(74) *Attorney, Agent, or Firm* — Workman Nydegger

(57) ABSTRACT

A second semiconductor layer is oxidized through a groove and a fourth semiconductor layer is oxidized, a first oxide layer is formed, and a second oxide layer is formed. By oxidizing the entire second semiconductor layer and the fourth semiconductor layer, the first oxide layer and the second oxide layer in an amorphous state are formed.

8 Claims, 10 Drawing Sheets

(56) References Cited

U.S. PATENT DOCUMENTS

2018/0337306 A1* 11/2018 Matsumoto ........... C30B 29/406
2023/0005745 A1* 1/2023 Nakao ............... H01L 21/02546

OTHER PUBLICATIONS

J. G. Fiorenza et al., *Aspect Ratio Trapping: A Unique Technology for Integrating Ge and III-Vs with Silicon CMOS*, ECS Transactions, vol. 33, No. 6, 2010, pp. 963-976.

L. Czornomaz et al., *Confined Epitaxial Lateral Overgrowth (CELO): A Novel Concept for Scalable Integration of CMOS-compatible InGaAs-on-insulator MOSFETs on Large-Area Si Substrates*, 2015 Symposium on VLSI Technology Digest of Technical Papers, Jun. 2016, pp. T172-T173.

R. Hull et al., *Role of Strained Layer Superlattices in Misfit Dislocation Reduction in Growth of epitaxial Ge0.5Si0.5 Alloys on Si(100) Substrates*, Journal of Applied Physics, vol. 65, No. 12, 1989, pp. 4723-4729.

\* cited by examiner

METHOD FOR FORMING SEMICONDUCTOR LAYERS

TECHNICAL FIELD

The present invention relates to a method for forming a semiconductor layer and relates to a method for forming a semiconductor layer in which semiconductor crystals having a lattice constant different from that of a substrate are grown on the substrate.

BACKGROUND ART

Semiconductor thin films are used as materials for electronic devices and optical devices. Most semiconductors used for devices have layered structures and semiconductor crystals are grown on a substrate made of a semiconductor, sapphire, or the like using crystal growth devices. Crystal growth has been performed such that there is lattice-matching with respect to a substrate, but in order to improve mass productivity and device characteristics, lattice-mismatched growth (heteroepitaxial growth) such as GaN crystal growth on a sapphire substrate and compound semiconductor crystal growth on a Si substrate has been also performed.

In heteroepitaxial growth, various crystal defects are introduced at a hetero interface, and these defects penetrate into layers (device layers) constituting electronic and optical semiconductor devices. Since these penetration defects cause deterioration in device characteristics, it is important to inhibit penetration defects (a threading dislocation density). Several techniques for reducing the threading dislocation density have been proposed so far, which include, for example, epitaxial lateral overgrowth (ELO), aspect ratio trapping (ART), confined epitaxial lateral overgrowth (CELO), dislocation filters based on strained layer superlattice (SLS), and the like.

For example, in ELO described in NPL 1, a material such as $SiO_2$ is deposited on a semiconductor substrate for heteroepitaxial growth to form a mask, an opening portion is provided in a part of the mask, and crystal growth is performed from a surface of the semiconductor substrate exposed on a bottom surface of the opening portion. In this crystal growth, by using growth conditions for growing (laterally growing) semiconductor crystals to cover the mask around the opening portion in addition to immediately above the mask opening portion, it is possible to inhibit propagation of dislocations from the substrate in a semiconductor layer formed on the mask. However, in ELO, not only the lateral growth on the mask but also growth in a vertical direction of the substrate is performed at the same time, and the amount that can laterally grow is minute under many growth conditions. For this reason, it has been difficult to obtain a defect-free region over a large area.

Next, the ART described in NPL 2 will be described. ART is a method of forming a mask including an opening having a stripe structure of which a ratio of a thickness to a length (a width) in a plane direction (aspect ratio) is increased and selectively performing crystal growth on a substrate surface at a location of the opening, thereby terminating dislocations at an inner wall of the opening. However, while there is an effect of inhibiting dislocation propagation in a direction orthogonal to the direction in which stripes extend, dislocation propagation cannot be inhibited in the direction in which the stripes extend because there is no inner wall. Further, when the aspect ratio is increased to perform the growth, problems that a region that can grow crystals becomes smaller and a surface on which crystals have been grown becomes uneven occur.

Next, CELO described in NPL 3 will be described. CELO is a method of processing an insulating film formed on a substrate to form a thin channel on a surface of the substrate, and performing supply of raw materials and growth via the channel to significantly reduce a dislocation density. In CELO, growth in a vertical direction of the substrate, which has been a problem in ELO, is inhibited by the insulating film on the upper side, and thus lateral growth is promoted and a defect-free region is easily formed. However, CELO requires, as a pre-stage for crystal growth of a semiconductor layer, complicated and multiple steps of (1) forming a lower insulating film, (2) processing the lower insulating layer, (3) accumulating a sacrificial layer, (4) accumulating an upper insulating layer, (5) processing the upper insulating layer, and (6) removing the sacrificial layer.

Next, SLS described in NPL 4 will be described. In SLS, a dislocation filter is used. Since this dislocation filter is easily produced, SLS has been more widely used in the past. On the other hand, in SLS, the effect of reducing a dislocation density is small and a layer made of an insulating material is not formed, and thus after a device structure has been produced, it is not always possible to prevent numbers of dislocations from increasing from a substrate side toward a layer on which devices are formed.

CITATION LIST

Non Patent Literature

[NPL 1] H. Kataria et al., "Simple Epitaxial Lateral Overgrowth Process as a Strategy for Photonic Integration on Silicon", IEEE Journal of Selected Topics in Quantum Electronics, vol. 20, no. 4, 8201407, 2014.

[NPL 2] J. G. Fiorenza et al., "Aspect Ratio Trapping: a Unique Technology for Integrating Ge and III-Vs with Silicon CMOS", ECS Transactions, vol. 33, no. 6, pp. 963-976, 2010.

[NPL 3] L. Czornomaz et al., "Confined Epitaxial Lateral Overgrowth (CELO): A Novel Concept for Scalable Integration of CMOS-compatible InGaAs-on-insulator MOSFETs on Large-Area Si Substrates", Symposium on VLSI Technology Digest of Technical Papers, 13-3, pp. T172-T173, 2015.

[NPL 4] R. Hull. et al., "Role of strained layer superlattices in misfit dislocation reduction in growth of epitaxial Ge0.5Si0.5 alloys on Si (100) substrates", Journal of Applied Physics, vol. 65, no. 12, pp. 4723-4729, 1989.

SUMMARY OF THE INVENTION

Technical Problem

As described above, various methods for reducing the dislocation density during heteroepitaxial growth have been proposed, but these conventional techniques have problems in which the effect of inhibiting dislocations is large while production is difficult, production is easy while the effect of inhibiting dislocations is small, or it is difficult to achieve both of ease of production and the effect of reducing dislocations.

The present invention has been made to solve the above problems, and an object of the present invention is to provide a method for forming a semiconductor layer, in which a dislocation density can be reduced and which can be easily produced.

Means for Solving the Problem

A method for forming a semiconductor layer according to the present invention includes: a first step of crystal growth of a first semiconductor layer having a lattice constant in a surface direction of a surface of a substrate different from that of the substrate on the substrate; a second step of crystal growth of a second semiconductor layer on and in contact with the first semiconductor layer; a third step of crystal growth of a third semiconductor layer on and in contact with the second semiconductor layer; a fourth step of crystal growth of a fourth semiconductor layer on and in contact with the third semiconductor layer; a fifth step of forming a groove that penetrates the fourth semiconductor layer and the third semiconductor layer and reaches the second semiconductor layer; a sixth step of oxidizing the second semiconductor layer through the groove to form a first oxide layer and oxidizing the fourth semiconductor layer to form a second oxide layer; a sixth step of removing a part of the third semiconductor layer by selectively etching the third semiconductor layer through the groove using the second oxide layer as a mask and leaving a fifth semiconductor layer between the first oxide layer and the second oxide layer; a seventh step of performing crystal regrowth from the fifth semiconductor layer to form a sixth semiconductor layer between the first oxide layer and the second oxide layer; an eighth step of removing the second oxide layer on the fifth semiconductor layer to form a mask layer; a ninth step of removing the fifth semiconductor layer using the mask layer as a mask; and a tenth step of removing the mask layer after removing the fifth semiconductor layer.

A method for forming a semiconductor layer according to the present invention includes: a first step of crystal growth of a first semiconductor layer having a lattice constant in a surface direction of a surface of a substrate different from that of the substrate on the substrate; a second step of crystal growth of a second semiconductor layer on and in contact with the first semiconductor layer; a third step of crystal growth of a third semiconductor layer on and in contact with the second semiconductor layer; a fourth step of forming an insulating layer on and in contact with the third semiconductor layer; a fifth step of forming a groove that penetrates the insulating layer and the third semiconductor layer and reaches the second semiconductor layer; a sixth step of oxidizing the second semiconductor layer through the groove to form an oxide layer; a sixth step of removing a part of the third semiconductor layer by selectively etching the third semiconductor layer through the groove using the insulating layer as a mask and leaving a fifth semiconductor layer between the oxide layer and the insulating layer; a seventh step of performing crystal regrowth from the fifth semiconductor layer to form a sixth semiconductor layer between the oxide layer and the insulating layer; an eighth step of removing the insulating layer on the fifth semiconductor layer to form a mask layer; a ninth step of removing the fifth semiconductor layer using the mask layer as a mask; and a tenth step of removing the mask layer after removing the fifth semiconductor layer.

Effects of the Invention

As described above, according to the present invention, since the second semiconductor layer is oxidized through the groove to form the first oxide layer, and the crystal regrowth is performed laterally from the fifth semiconductor layer formed by removing a part of the third semiconductor layer to form the sixth semiconductor layer, it is possible to provide a method for forming a semiconductor layer, in which dislocation density can be reduced and which can be easily produced.

DESCRIPTION OF EMBODIMENTS

Figure 1A:
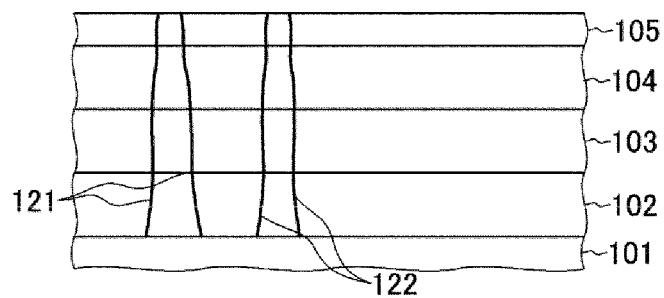
FIG. 1A is a cross-sectional view showing a state of semiconductor layers in an intermediate step for describing a method for forming a semiconductor layer according to a first embodiment of the present invention.

Hereinafter, a method for forming a semiconductor layer according to embodiments of the present invention will be described.

First Embodiment

First, a method of forming a semiconductor layer according to a first embodiment of the present invention will be described with reference to FIGS. 1A to 1H. First, a first semiconductor layer 102 having a lattice constant in a surface direction of a surface of a substrate 101 different from that of the substrate 101 is made to undergo crystal growth on the substrate 101 (a first step). Subsequently, a second semiconductor layer 103 is made to undergo crystal growth on and in contact with the first semiconductor layer 102 (a second step), a third semiconductor layer 104 is made to undergo crystal growth on and in contact with the second semiconductor layer 103 (a third step); and a fourth semiconductor layer 105 is made to undergo crystal growth on and in contact with the third semiconductor layer 104 (a fourth step).

For example, the substrate 101 may be made of Si, and the first semiconductor layer 102 and the third semiconductor layer 104 may be made of a compound semiconductor such as GaAs. The second semiconductor layer 103 and the fourth semiconductor layer 105 are made of AlGaAs. AlGaAs is a compound semiconductor containing Al. Also, the first semiconductor layer 102 and the third semiconductor layer 104 can be made of InP, and the second semiconductor layer 103 and the fourth semiconductor layer 105 can be made of AlAsSb. AlAsSb is a compound semiconductor containing Al. Each semiconductor layer can be formed, for example, using an organic metal vapor phase growth method, a molecular beam epitaxy method, or the like. Further, each semiconductor layer can be formed by crystal growth in one continuous crystal growth step by using the same growth device and changing raw materials.

The first semiconductor layer 102 and the third semiconductor layer 104 made of GaAs, and the second semiconductor layer 103 and the fourth semiconductor layer 105 made of AlGaAs are different from the substrate 101 made of Si in terms of the lattice constant in the surface direction of the surface of the substrate 101 made of Si. For this reason, at a hetero-interface between the substrate 101 and the first semiconductor layer 102, threading dislocations 121 and threading dislocations 122 are generated, and the generated threading dislocations 121 and 122 propagate to a surface of the fourth semiconductor layer 105.

Figure 1B:
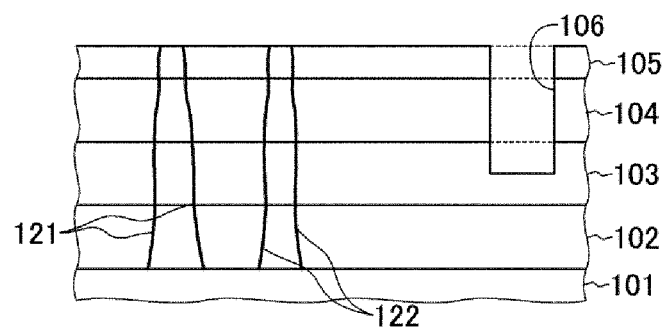
FIG. 1B is a cross-sectional view showing a state of the semiconductor layers in an intermediate step for describing the method for forming a semiconductor layer according to the first embodiment of the present invention.

Next, as shown in FIG. 1B, a groove 106 that penetrates the fourth semiconductor layer 105 and the third semiconductor layer 104 and reaches the second semiconductor layer 103 is formed (a fifth step). For example, the groove 106 can be formed by patterning the fourth semiconductor layer 105, the third semiconductor layer 104, and a part of the second semiconductor layer 103 in a thickness direction thereof using a well-known lithography technique and etching technique. Lithography can be performed using a stepper exposure device or an electron beam lithography device using ultraviolet rays as a light source. Further, the etching may include wet etching and dry etching, and combinations thereof can be appropriately selected and used.

Figure 1C:
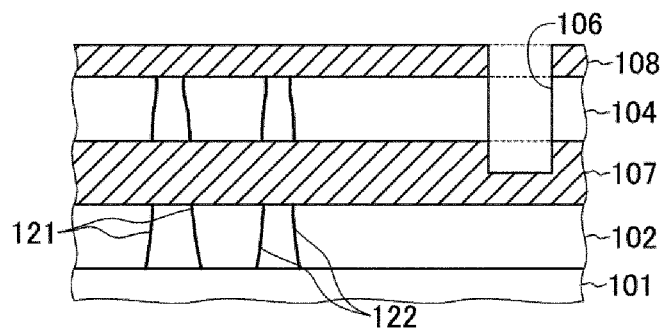
FIG. 1C is a cross-sectional view showing a state of the semiconductor layers in an intermediate step for describing the method for forming a semiconductor layer according to the first embodiment of the present invention.

Next, the second semiconductor layer 103 is oxidized through the groove 106 and the fourth semiconductor layer 105 is oxidized, and as shown in FIG. 1C, a first oxide layer 107 is formed and the second oxide layer 108 is formed (a sixth step). By oxidizing the entire second semiconductor layer 103 and fourth semiconductor layer 105, the first oxide layer 107 and the second oxide layer 108 in an amorphous state are formed. When the first semiconductor layer 102 and the second semiconductor layer 103 are made of a compound semiconductor that is not oxidized (hard to be oxidized), such as one that does not contain Al, the second semiconductor layer 103 and the fourth semiconductor layer 105 can be selectively oxidized.

For example, the first oxide layer 107 and the second oxide layer 108 are formed by oxidizing AlGaAs using well-known thermal steam oxidation. It is known that AlGaAs having an Al composition ratio of 80% or more can be oxidized, and the second semiconductor layer 103 and the fourth semiconductor layer 105 are preferably made of AlGaAs having such a composition.

When AlGaAs is steam-oxidized, aluminum oxide ($AlO_x$) such as amorphous $Al_2O_3$ is formed. Accordingly, the first oxide layer 107 and the second oxide layer 108 are considered to be layers in an amorphous state. Since such an amorphous layer does not have a crystal structure, it has an effect of terminating dislocations of adjacent semiconductor layers in the thickness direction.

Figure 1D:
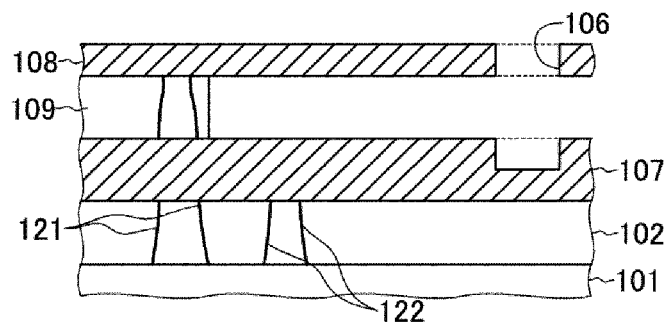
FIG. 1D is a cross-sectional view showing a state of the semiconductor layers in an intermediate step for describing the method for forming a semiconductor layer according to the first embodiment of the present invention.

Next, using the second oxide layer 108 as a mask, on which the groove 106 is formed, the third semiconductor layer 104 is selectively etched through the groove 106 to remove a part of the third semiconductor layer 104. In this etching, the third semiconductor layer 104 is removed from a position of the groove 106 in the surface direction of the substrate 101. Due to this processing, as shown in FIG. 1D, a fifth semiconductor layer 109 is left between the first oxide layer 107 and the second oxide layer 108 (a sixth step). A width for removing the third semiconductor layer 104 from the position of the groove 106 in the surface direction of the substrate 101 is equal to or larger than a length in the surface direction of the substrate required for a case of finally forming a semiconductor device.

In the steps up to this point, in CELO, which is a conventional technique, almost the same structure as one requiring a multiple number of depositions of insulating materials and sacrificial layer materials can be obtained through a single crystal growth step and steam oxidation.

Figure 1E:
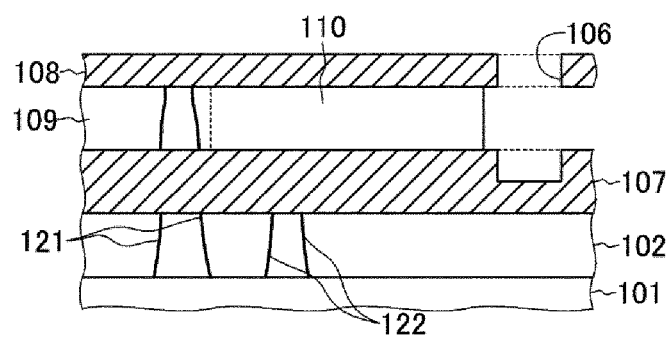
FIG. 1E is a cross-sectional view showing a state of the semiconductor layers in an intermediate step for describing the method for forming a semiconductor layer according to the first embodiment of the present invention.

Next, GaAs is crystal-regrown from the fifth semiconductor layer 109. GaAs is crystal-regrown from an exposed side surface of the fifth semiconductor layer 109 in a region sandwiched between the first oxide layer 107 and the second oxide layer 108. Due to this crystal regrowth, as shown in FIG. 1E, a sixth semiconductor layer 110 is formed between the first oxide layer 107 and the second oxide layer 108 in the thickness direction (a seventh step). Since the sixth semiconductor layer 110 is epitaxially grown in the surface direction (so-called a lateral direction) of the substrate 101, propagation of dislocations (the threading dislocations 121 and the threading dislocations 122) from the substrate 101 is inhibited, and the sixth semiconductor layer 110 can be formed without dislocations.

Further, in this crystal regrowth, a portion at which a semiconductor surface is exposed is only the side surface of the fifth semiconductor layer 109 formed from the etching described above. In addition, the region for crystal regrowth is covered with the first oxide layer 107 and the second oxide layer 108 from above and below in the thickness direction. For this reason, in this crystal regrowth, the sixth semiconductor layer 110 can be selectively grown in the lateral direction. This eliminates drawbacks of ELO, which is a conventional technique.

Figure 1F:
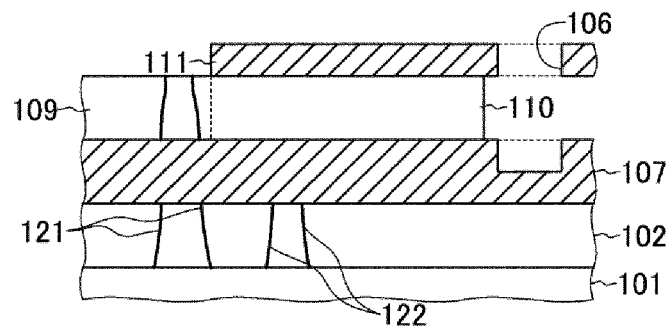
FIG. 1F is a cross-sectional view showing a state of the semiconductor layers in an intermediate step for describing the method for forming a semiconductor layer according to the first embodiment of the present invention.
Figure 1G:
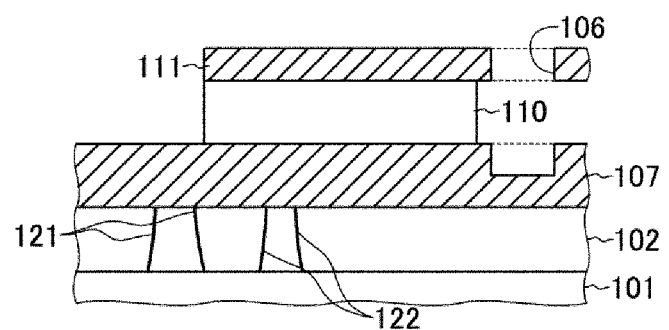
FIG. 1G is a cross-sectional view showing a state of the semiconductor layers in an intermediate step for describing the method for forming a semiconductor layer according to the first embodiment of the present invention.
Figure 1H:
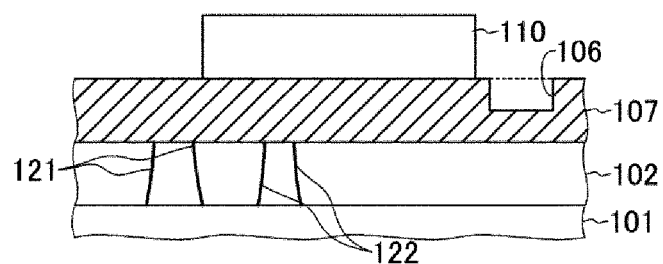
FIG. 1H is a cross-sectional view showing a state of the semiconductor layers in an intermediate step for describing the method for forming a semiconductor layer according to the first embodiment of the present invention.

Next, by removing the second oxide layer 108 on the sixth semiconductor layer 110, a mask layer 111 is formed as shown in FIG. 1F (an eighth step). Next, the fifth semiconductor layer 109 is selectively removed using the mask layer 111 as a mask to bring about a state in which only the sixth semiconductor layer 110 is formed on the first oxide layer 107, as shown in FIG. 1G (a ninth step). After the fifth semiconductor layer 109 is removed in this way, the mask layer 111 is removed, and as shown in FIG. 1H, an upper portion (upper surface) of the sixth semiconductor layer 110 is exposed (a tenth step).

Using the above forming method, the sixth semiconductor layer 110 having almost no (less) crystal defects and a low dislocation density can be formed.

Incidentally, in the step of removing the second oxide layer 108 on the fifth semiconductor layer 109, an exposed surface of the first oxide layer 107 made of the same material is also removed. For this reason, when the first oxide layer 107 is thin, an upper surface of the first semiconductor layer 102 may be exposed. Since the first semiconductor layer 102 has dislocations, the dislocations of the first semiconductor layer 102 may propagate upward in a process of forming a structure of the device through subsequent crystal growth.

In order to solve this problem, the second semiconductor layer 103 is formed to be sufficiently thicker than the fourth semiconductor layer 105, and the first oxide layer 107 is formed to be thicker than the second oxide layer 108. Further, in a case in which the groove 106 is formed up to a part of the first oxide layer 107 in the thickness direction, it is desirable that the etching depth be also added to form the second semiconductor layer 103 sufficiently thicker than the fourth semiconductor layer 105.

Figure 2:
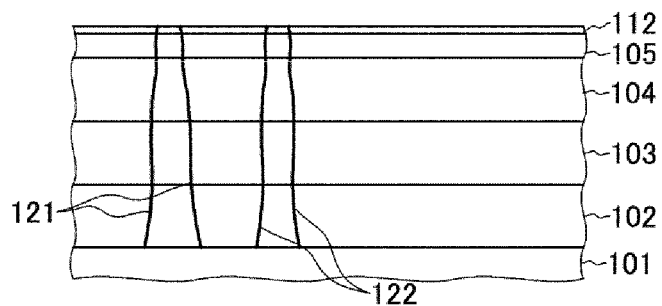
FIG. 2 is a cross-sectional view showing a state of semiconductor layers in an intermediate step for describing another method for forming a semiconductor layer according to the first embodiment of the present invention.

Also, as shown in FIG. 2, a cap layer 112 can also be formed on the fourth semiconductor layer 105. For example, the cap layer 112 is made of GaAs. In a case in which the first semiconductor layer 102 and the third semiconductor layer 104 are made of InP, the cap layer 112 is made of InP. With such a configuration, unintended natural oxidation of the fourth semiconductor layer 105 can be inhibited. When the cap layer 112 is made sufficiently thin, the cap layer 112 can be removed at the same time in the step of forming the fifth semiconductor layer 109 in the removal of a part of the third semiconductor layer 104 by the selective etching through the groove 106. As a guideline for a thickness of the cap layer 112, a volume of the cap layer 112 to be removed is designed to be smaller than a volume of the third semiconductor layer 104 to be removed by the selective etching.

As described above, according to the first embodiment, since the second semiconductor layer and the fourth semiconductor layer are oxidized through the groove to form the first oxide layer and the second oxide layer, and the sixth semiconductor layer is formed by performing the crystal regrowth laterally from the fifth semiconductor layer sandwiched therebetween, it is possible to form a semiconductor layer having a reduced dislocation density through a simple manufacturing process.

Second Embodiment

Figure 3A:
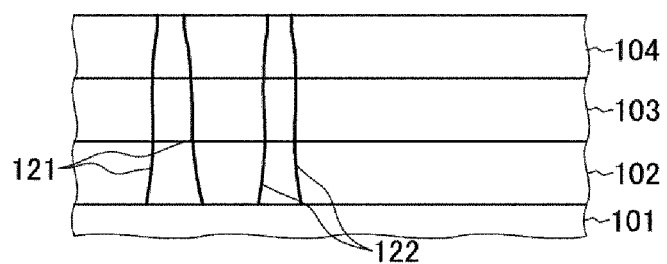
FIG. 3A is a cross-sectional view showing a state of semiconductor layers in an intermediate step for describing a method of forming a semiconductor layer according to a second embodiment of the present invention.

Next, a method of forming a semiconductor layer according to a second embodiment of the present invention will be described with reference to FIGS. 3A to 3I. First, as shown in FIG. 3A, the first semiconductor layer 102 having a lattice constant in the surface direction of the surface of the substrate 101 different from that of the substrate 101 is made to undergo crystal growth on the substrate 101 (a first step). Subsequently, the second semiconductor layer 103 is made to undergo crystal growth on and in contact with the first semiconductor layer 102 (a second step), and the third semiconductor layer 104 is made to undergo crystal growth on and in contact with the second semiconductor layer 103 (a third step).

For example, the substrate 101 is made of Si, and the first semiconductor layer 102 and the third semiconductor layer 104 are made of a compound semiconductor such as GaAs. The second semiconductor layer 103 is made of AlGaAs. AlGaAs is a compound semiconductor containing Al. In particular, AlGaAs having an Al composition of 0.8 or more can be easily oxidized using a steam oxidation method or the like. Further, the first semiconductor layer 102 and the third semiconductor layer 104 may be made of InP, and the second semiconductor layer 103 may be made of AlAsSb. AlAsSb is a compound semiconductor containing Al. By appropriately controlling the Al composition, AlAsSb lattice-matched with InP can be formed, and an oxide film can be easily formed using a steam oxidation method or the like.

For example, each semiconductor layer can be formed using an organic metal vapor phase growth method, a molecular beam epitaxy method, or the like. Also, each semiconductor layer can be formed by crystal growth in one continuous crystal growth step by using the same growth device and changing raw materials.

The first semiconductor layer 102 and the third semiconductor layer 104 made of GaAs, and the second semiconductor layer 103 made of AlGaAs have different lattice constants in the surface direction of the surface of the substrate 101 from that of the substrate 101 made of Si. For this reason, at the hetero interface between the substrate 101 and the first semiconductor layer 102, the threading dislocations 121 and 122 are generated, and the generated threading dislocations 121 and 122 propagate up to the surface of the third semiconductor layer 104.

Figure 3B:
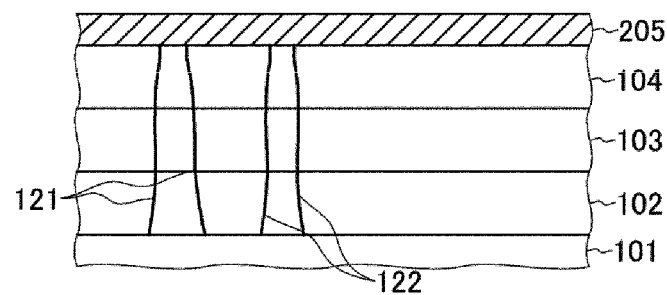
FIG. 3B is a cross-sectional view showing a state of the semiconductor layers in an intermediate step for describing the method of forming a semiconductor layer according to the second embodiment of the present invention.

Next, as shown in FIG. 3B, an insulating layer 205 is formed on and in contact with the third semiconductor layer 104 (a fourth step). For example, the insulating layer 205 is formed by depositing a dielectric (insulator) such as $SiO_2$ using a chemical vapor deposition (CVD) method, a sputtering method, or the like. The insulating layer 205 formed in this way is in an amorphous state. The insulating layer 205 is not limited to $SiO_2$, and may be made of $AlO_x$, AlN, or the like. Further, it is also possible to form a multi-layer structure in which layers of these materials are combined. In the second embodiment, the insulating layer 205 is used instead of the second oxide layer 108 (fourth semiconductor layer 105) of the first embodiment.

Figure 3C:
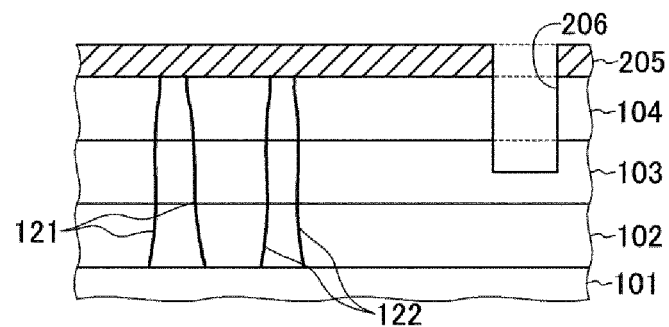
FIG. 3C is a cross-sectional view showing a state of the semiconductor layers in an intermediate step for describing the method of forming a semiconductor layer according to the second embodiment of the present invention.

Next, as shown in FIG. 3C, a groove 206 that penetrates the insulating layer 205 and the third semiconductor layer 104 and reaches the second semiconductor layer 103 is formed (a fifth step). For example, the groove 206 can be formed by patterning the insulating layer 205, the third semiconductor layer 104, and a part of the second semiconductor layer 103 in the thickness direction using a well-known lithography technique and etching technique. Lithography can be performed by using a stepper exposure device or an electron beam lithography device using ultraviolet rays as a light source. Further, the etching includes wet etching and dry etching, which can be appropriately selected and used including a combination of these etchings.

Figure 3D:
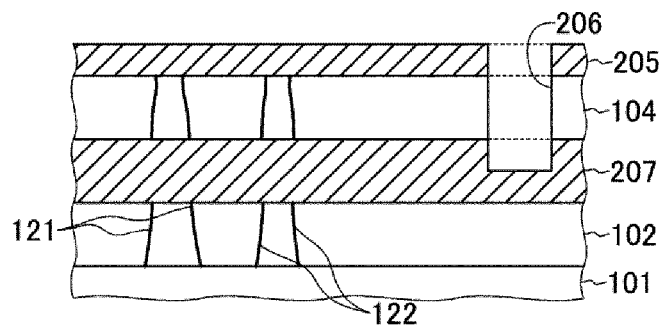
FIG. 3D is a cross-sectional view showing a state of the semiconductor layers in an intermediate step for describing the method of forming a semiconductor layer according to the second embodiment of the present invention.

Next, the second semiconductor layer 103 is oxidized through the groove 206, and as shown in FIG. 3D, an oxide layer 207 is formed (a sixth step). By oxidizing the entire second semiconductor layer 103, the amorphous oxide layer 207 is formed. When the first semiconductor layer 102 and the third semiconductor layer 104 are made of a compound semiconductor that is not oxidized (hard to be oxidized), such as one that does not contain Al or has an extremely low Al composition, the second semiconductor layer 103 can be selectively oxidized.

For example, the oxide layer 207 is formed by oxidizing AlGaAs using well-known thermal steam oxidation. It is known that AlGaAs having an Al composition ratio of 80% or more can be oxidized, and the second semiconductor layer 103 is preferably formed from AlGaAs having such a composition.

When AlGaAs is steam-oxidized, aluminum oxide ($AlO_x$) such as amorphous $Al_2O_3$ is formed. Accordingly, the oxide layer 207 is considered to be a layer in an amorphous state. Since such an amorphous layer does not have a crystal structure, it has an effect of terminating dislocations of adjacent semiconductor layers in the thickness direction.

Figure 3E:
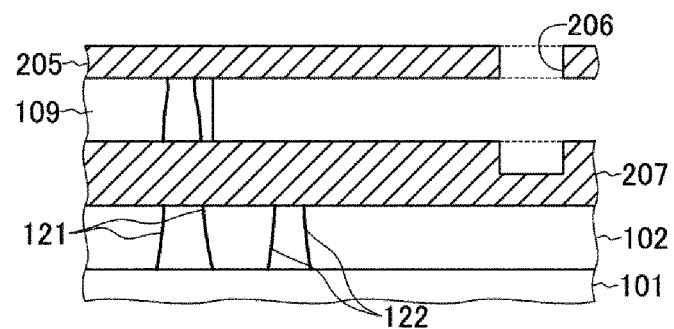
FIG. 3E is a cross-sectional view showing a state of the semiconductor layers in an intermediate step for describing the method of forming a semiconductor layer according to the second embodiment of the present invention.

Next, using the insulating layer 205 as a mask, on which the groove 206 is formed, the third semiconductor layer 104 is selectively etched through the groove 206 to remove a part of the third semiconductor layer 104. In this etching, the third semiconductor layer 104 is removed from a position of the groove 206 in the surface direction of the substrate 101. Due to this etching, as shown in FIG. 3E, the fifth semiconductor layer 109 is left between the oxide layer 207 and the insulating layer 205 (a sixth step). A width for removing the third semiconductor layer 104 from the position of the groove 206 in the surface direction of the substrate 101 is equal to or larger than a length in the substrate surface direction required for a case of finally forming a semiconductor device.

In the steps up to this point, in CELO, which is a conventional technique, almost the same structure as one requiring a multiple number of depositions of insulating materials and sacrificial layer materials can be obtained through one crystal growth step, one insulating layer formation step, and steam oxidation.

Figure 3F:
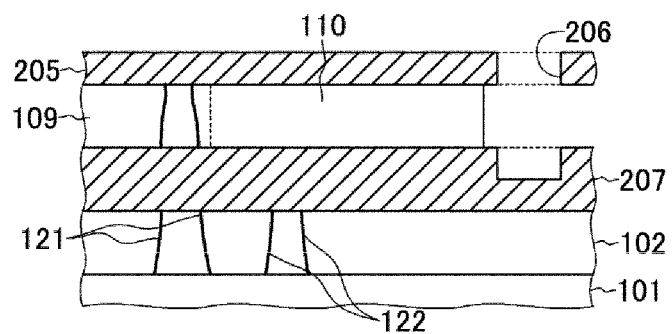
FIG. 3F is a cross-sectional view showing a state of the semiconductor layers in an intermediate step for describing the method of forming a semiconductor layer according to the second embodiment of the present invention.

Next, GaAs is crystal-regrown from the fifth semiconductor layer 109. GaAs is crystal-regrown from the exposed side surface of the fifth semiconductor layer 109 in a region sandwiched between the oxide layer 207 and the insulating layer 205. Due to this crystal regrowth, as shown in FIG. 3F, the sixth semiconductor layer 110 is formed between the oxide layer 207 and the insulating layer 205 in the thickness direction (a seventh step). Since the sixth semiconductor layer 110 is epitaxially grown in the surface direction (so-called the lateral direction) of the substrate 101, the propagation of dislocations (the threading dislocations 121 and the threading dislocations 122) from the substrate 101 is inhibited, and the sixth semiconductor layer 110 can be formed without dislocations.

In addition, in this crystal regrowth, the portion at which the semiconductor surface is exposed is only the side surface of the fifth semiconductor layer 109 formed by the etching described above. Further, the region for crystal regrowth is covered with the oxide layer 207 and the insulating layer 205 from above and below in the thickness direction. For this reason, in this crystal regrowth, the sixth semiconductor layer 110 can be selectively grown in the lateral direction. This eliminates the drawbacks of ELO, which is a conventional technique.

Figure 3G:
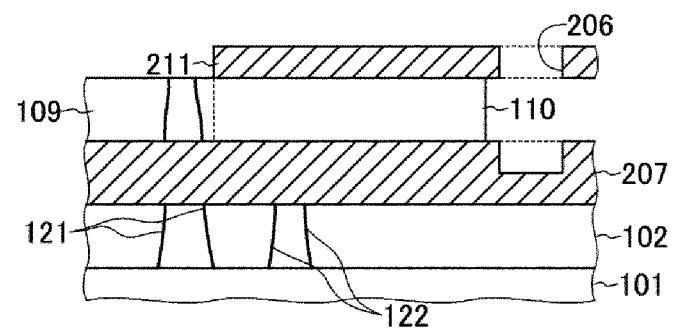
FIG. 3G is a cross-sectional view showing a state of the semiconductor layers in an intermediate step for describing the method of forming a semiconductor layer according to the second embodiment of the present invention.
Figure 3H:
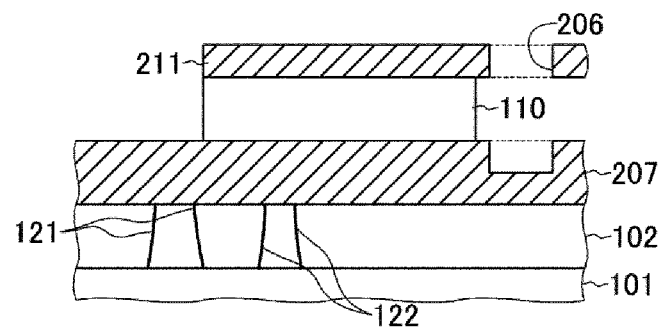
FIG. 3H is a cross-sectional view showing a state of the semiconductor layers in an intermediate step for describing the method of forming a semiconductor layer according to the second embodiment of the present invention.
Figure 3I:
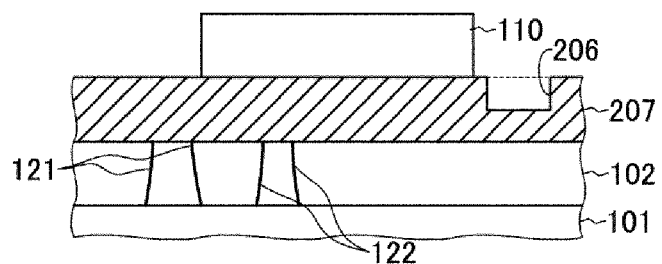
FIG. 3I is a cross-sectional view showing a state of the semiconductor layers in an intermediate step for describing the method of forming a semiconductor layer according to the second embodiment of the present invention.

Next, by removing the insulating layer 205 on the sixth semiconductor layer 110, a mask layer 211 is formed as shown in FIG. 3G (an eighth step). Next, the fifth semiconductor layer 109 is selectively removed using the mask layer 211 as a mask to be in a state in which only the sixth semiconductor layer 110 is formed on the oxide layer 207, as shown in FIG. 3H (a ninth step). After the fifth semiconductor layer 109 is removed in this way, the mask layer 211 is removed to expose the upper portion (upper surface) of the sixth semiconductor layer 110 as shown in FIG. 3H (a tenth step).

Using the above forming method, the sixth semiconductor layer 110 having almost no (less) crystal defects and a low dislocation density can be formed as in the first embodiment.

Incidentally, in the step of removing the insulating layer 205 on the fifth semiconductor layer 109, an exposed surface of the oxide layer 207 may also be removed. For this reason, when the oxide layer 207 is thin, the upper surface of the first semiconductor layer 102 may be exposed. Since the first semiconductor layer 102 has dislocations, the dislocations of the first semiconductor layer 102 may propagate upward in the process of forming a structure of a device through subsequent crystal growth.

In order to solve this problem, the second semiconductor layer 103 is formed to be sufficiently thicker than the insulating layer 205. Further, in a case in which the groove 206 is formed up to a part of the oxide layer 207 in the thickness direction, it is desirable that the etching depth be also added to form the second semiconductor layer 103 sufficiently thicker than the insulating layer 205.

As described above, according to the second embodiment, since the second semiconductor layer is oxidized through the groove to form the oxide layer, and the sixth semiconductor layer is formed by performing the crystal regrowth laterally from the fifth semiconductor layer sandwiched between the insulating layer and the oxide layer, a semiconductor layer having a reduced dislocation density can be formed through a simple manufacturing process.

As described above, according to the present invention, since the second semiconductor layer is oxidized through the groove to form the first oxide layer, and the sixth semiconductor layer is formed by performing the crystal regrowth laterally from the fifth semiconductor layer formed by removing a part of the third semiconductor layer, it is possible to provide the method for forming a semiconductor layer, in which dislocation density can be reduced and which can be easily produced.

Also, it is apparent that the present invention is not limited to the embodiments described above and many modifications and combinations can be carried out by those having ordinary knowledge in the art within the technical idea of the present invention.

REFERENCE SIGNS LIST

101 Substrate
102 First semiconductor layer
103 Second semiconductor layer
104 Third semiconductor layer
105 Fourth semiconductor layer 106 Groove
107 First oxide layer
108 Second oxide layer
109 Fifth semiconductor layer
110 Sixth semiconductor layer
111 Mask layer
112 Cap layer
121 Threading dislocation
122 Threading dislocation

The invention claimed is:

1. A method for forming a semiconductor layer comprising:
   a first step of crystal growth of a first semiconductor layer having a lattice constant in a surface direction of a surface of a substrate different from that of the substrate on the substrate;
   a second step of crystal growth of a second semiconductor layer on and in contact with the first semiconductor layer;
   a third step of crystal growth of a third semiconductor layer on and in contact with the second semiconductor layer;
   a fourth step of crystal growth of a fourth semiconductor layer on and in contact with the third semiconductor layer;
   a fifth step of forming a groove that penetrates the fourth semiconductor layer and the third semiconductor layer and reaches the second semiconductor layer;
   a sixth step of oxidizing the second semiconductor layer through the groove to form a first oxide layer and oxidizing the fourth semiconductor layer to form a second oxide layer;
   a sixth step of removing a part of the third semiconductor layer by selectively etching the third semiconductor layer through the groove using the second oxide layer as a mask and leaving a fifth semiconductor layer between the first oxide layer and the second oxide layer;
   a seventh step of performing crystal regrowth from the fifth semiconductor layer to form a sixth semiconductor layer between the first oxide layer and the second oxide layer;
   an eighth step of removing the second oxide layer on the fifth semiconductor layer to form a mask layer;
   a ninth step of removing the fifth semiconductor layer using the mask layer as a mask; and
   a tenth step of removing the mask layer after removing the fifth semiconductor layer.

2. The method for forming a semiconductor layer according to claim 1, wherein
   the second semiconductor layer and the fourth semiconductor layer are made of a compound semiconductor containing Al, and
   the first semiconductor layer and the third semiconductor layer are made of a compound semiconductor.

3. The method for forming a semiconductor layer according to claim 2, wherein the second semiconductor layer is formed to be thicker than the fourth semiconductor layer.

4. The method for forming a semiconductor layer according to claim 1, wherein the second semiconductor layer is formed to be thicker than the fourth semiconductor layer.

5. A method for forming a semiconductor layer comprising:
   a first step of crystal growth of a first semiconductor layer having a lattice constant in a surface direction of a surface of a substrate different from that of the substrate on the substrate;
   a second step of crystal growth of a second semiconductor layer on and in contact with the first semiconductor layer;
   a third step of crystal growth of a third semiconductor layer on and in contact with the second semiconductor layer;
   a fourth step of forming an insulating layer on and in contact with the third semiconductor layer;
   a fifth step of forming a groove that penetrates the insulating layer and the third semiconductor layer and reaches the second semiconductor layer;
   a sixth step of oxidizing the second semiconductor layer through the groove to form an oxide layer;
   a sixth step of removing a part of the third semiconductor layer by selectively etching the third semiconductor layer through the groove using the insulating layer as a mask and leaving a fifth semiconductor layer between the oxide layer and the insulating layer;
   a seventh step of performing crystal regrowth from the fifth semiconductor layer to form a sixth semiconductor layer between the oxide layer and the insulating layer;
   an eighth step of removing the insulating layer on the fifth semiconductor layer to form a mask layer;
   a ninth step of removing the fifth semiconductor layer using the mask layer as a mask; and
   a tenth step of removing the mask layer after removing the fifth semiconductor layer.

6. The method for forming a semiconductor layer according to claim 5, wherein
   the second semiconductor layer is made of a compound semiconductor containing Al, and
   the first semiconductor layer and the third semiconductor layer are made of a compound semiconductor.

7. The method for forming a semiconductor layer according to claim 6, wherein the second semiconductor layer is formed to be thicker than the insulating layer.

8. The method for forming a semiconductor layer according to claim 5, wherein the second semiconductor layer is formed to be thicker than the insulating layer.

* * * * *